(12) United States Patent
Cox

(10) Patent No.: US 6,232,794 B1
(45) Date of Patent: May 15, 2001

(54) ELECTRONIC CIRCUIT WITH AUTOMATIC SIGNAL CONVERSION

(75) Inventor: David F. Cox, Los Lunas, NM (US)

(73) Assignee: University of New Mexico, Albuquerque, NM (US)

(*) Notice: Subject to any disclaimer, the term of this patent is extended or adjusted under 35 U.S.C. 154(b) by 0 days.

(21) Appl. No.: 09/316,470

(22) Filed: May 21, 1999

(51) Int. Cl.[7] .................................................. H03K 19/0175
(52) U.S. Cl. .................................................. 326/81; 326/80
(58) Field of Search .................................................. 326/81, 80, 68, 326/57, 58, 83, 87; 327/333

(56) References Cited

U.S. PATENT DOCUMENTS

| 5,666,070 | * | 9/1997 | Merritt et al. ......................... 326/81 |
| 5,834,948 | * | 11/1998 | Yoshizaki et al. ....................... 326/81 |
| 6,064,229 | * | 5/2000 | Morris ..................................... 326/81 |

* cited by examiner

Primary Examiner—David Nelms
Assistant Examiner—David Lam
(74) Attorney, Agent, or Firm—Haverstock & Owens LLP

(57) ABSTRACT

The system converts output signals from the conventional circuit into input signals configured for the ULP circuit. This system preferably scales down the output signals from the conventional circuit to allow the ULP circuit to receive these signals as corresponding input signals without damaging the ULP circuit. Further, the system also converts output signals from the ULP circuit into input signals configured for the conventional circuit. This system preferably increases the voltage level and voltage swing of the output signals from the ULP circuit to be compatible as corresponding input signals for the conventional circuit. The system is a circuit formed in a semiconductor substrate having improved immunity to total ionizing dose radiation. By back-biasing the n-type material and the p-type material, the effective threshold voltages of the transistors both drawn and parasitic are preferably dynamically tuned. Preferably, by optimizing the threshold voltages of the n-channel and p-channel transistors, the total ionizing dose radiation effect is neutralized and lower supply voltages are utilized for the circuit which would result in the circuit requiring less power.

16 Claims, 6 Drawing Sheets pulse(0.5V 100ns 1ns 200ns 400ns)

ELECTRONIC CIRCUIT WITH AUTOMATIC SIGNAL CONVERSION

FIELD OF THE INVENTION

The present invention relates to the field of power level conversion within an integrated circuit. More specifically, the present invention relates to the field of reducing the power level of an output signal from a conventional circuit such that the output signal is compatible as an input signal for an ultra low power circuit. Further, the present invention also relates to the field of increasing the power level of an output signal from the ultra low power circuit such that the output signal is compatible as an input signal for the conventional circuit.

BACKGROUND OF THE INVENTION

Conventional circuits are typically constructed of elements such as CMOS devices which require a supply voltage of 3.3 volts. Conventional CMOS devices typically deliver output signals that are up to 3.3 volts. Typical ultra low power (ULP) circuits require a substantially lower supply voltage compared to the conventional circuits. The supply voltage for the ULP circuits are typically 0.5 volts but can range between 0.1 volts to 2.0 volts. The ULP circuits typically deliver output signals that are up to 0.5 volts. The ULP circuits consume less power than the conventional circuits.

The ULP circuits play an important role in many electronic devices. The ULP circuits utilize lower supply voltages and consume less power while in an operating mode and a stand-by mode compared to the conventional circuits. As an added benefit to low power consumption, the ULP circuits also dissipate less heat when compared to the conventional circuits. As a result, the ULP circuits are most suitable for use in portable devices or other devices where minimizing power consumption and/or heat dissipation are important.

The ULP circuits are typically constructed of individual elements such as ULP CMOS devices. The ULP CMOS devices typically have oxide gates which are much thinner than conventional CMOS devices. These thinner oxide gates of the ULP CMOS devices are utilized to compensate for the lower gate voltages of the ULP circuits. As a result, the ULP CMOS devices are more susceptible to failure when input signal voltages exceed a predetermined maximum voltage level. The conventional CMOS devices deliver output signal voltages which can exceed this predetermined maximum voltage level. The ULP circuits cannot withstand these higher output signal voltages associated with the conventional circuits. Accordingly, the ULP circuits are not able to receive input signals from the conventional circuits.

To properly operate, the conventional circuits require a minimum input voltage level and minimum input voltage swings for incoming signals. The ULP circuits, by their nature, are not capable of generating an output signal that reaches the minimum power level or forming output signals which satisfy the minimum input voltage swings required by the conventional circuits. Thus, the ULP circuits are not capable of generating output signals that are compatible as input signals for the conventional circuits.

Therefore, what is needed is an electronic circuit that converts output signals from the convention circuit into an input signal compatible with the ULP circuit. Further, what is needed is an electronic circuit that converts an output signal from the ULP circuit into an input signal compatible with the conventional circuit.

SUMMARY OF THE INVENTION

A system converts output signals from the conventional circuit into input signals configured for the ULP circuit. This system preferably scales down the output signals from the conventional circuit to allow the ULP circuit to receive these signals as corresponding input signals without damaging the ULP circuit. Further, the system also converts output signals from the ULP circuit into input signals configured for the conventional circuit. This system preferably increases the voltage level and voltage swing of the output signals from the ULP circuit to be compatible as corresponding input signals for the conventional circuit. The system allows the conventional circuit to receive a converted input signal corresponding to an output signal from the ULP circuit and the ULP circuit to receive a converted input signal corresponding to an output signal from the conventional circuit. This system ensures that the ULP circuit remains protected from damage while providing the correct corresponding input signal to the appropriate circuit.

The system is a circuit formed in a semiconductor substrate having improved immunity to total ionizing dose radiation. The architecture of the circuit utilizes either the n-well, p-well, or dual-well processes. For example, the preferred embodiment of the system is described relative to a p-well process wherein the p-well is formed in an n-type substrate. A network of conventional NMOS or n-channel ULP transistors can be formed in the p-well, and a network of conventional PMOS or p-channel ULP transistors can be formed in the n-type substrate. Preferably, a contact is electrically coupled to the p-well region and is coupled to first means for independently controlling the voltage in the p-well region. Preferably, another contact is electrically coupled to the n-type substrate and is coupled to second means for independently controlling the voltage in the n-type substrate. By controlling the p-well voltage, the effective threshold voltages of the n-channel transistors both drawn and parasitic are preferably dynamically tuned. Likewise, by controlling the n-type substrate, the effective threshold voltages of the p-channel transistors both drawn and parasitic are also dynamically tuned. Preferably, by optimizing the threshold voltages of the n-channel and p-channel transistors, the total ionizing dose radiation effect is neutralized and lower supply voltages are utilized for the circuit which would result in the circuit requiring less power.

It is an object of the present invention to convert output signals from the conventional circuit into corresponding input signals for the ULP circuit. It is also an object to convert the output signals from the ULP circuit into corresponding input signals for the conventional circuit. It is a further object to provide these circuits with an improved immunity to total ionizing dose radiation.

DETAILED DESCRIPTION OF THE PRESENT INVENTION

The system of the present invention automatically converts output signals from a conventional circuit into input signals compatible with an ULP circuit. Further, the system of the present invention also automatically converts output signals from the ULP circuit into input signals compatible with the conventional circuit. The ULP circuit preferably includes ULP CMOS devices and other low voltage devices. The conventional circuit preferably includes 3.3 volt CMOS devices and other 3.3 volt devices. It would be apparent to those skilled in the art that the conventional circuit includes devices utilizing any appropriate voltage which is not considered low voltage.

Figure 1:
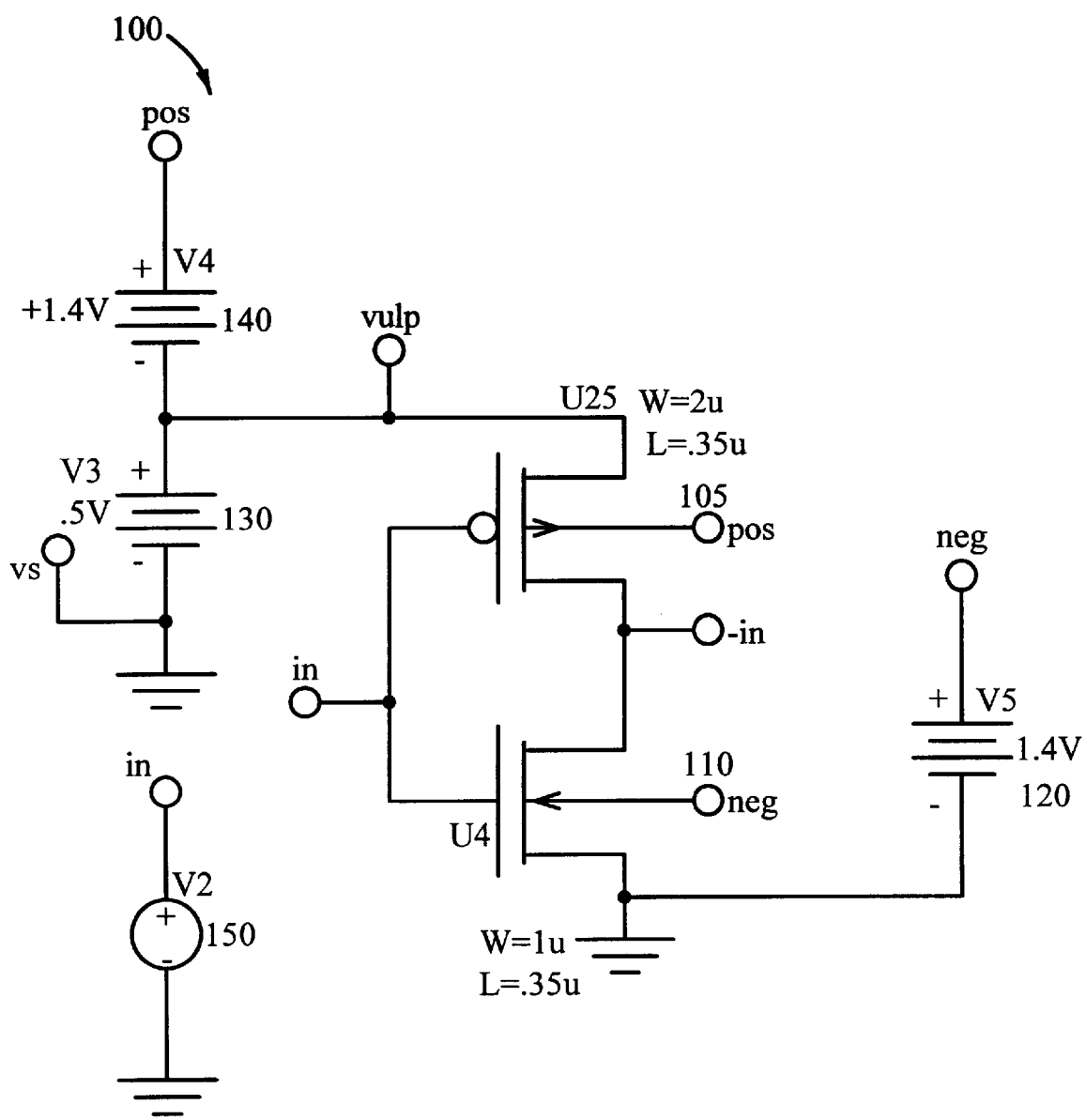
FIG. 1 illustrates a schematic diagram of an ultra low power inverter.

FIG. 1 illustrates an ultra low power (ULP) inverter 100. This ULP inverter 100 comprises a PMOS transistor 105, an NMOS transistor 110, and voltage sources 120, 130, 140, and 150. The PMOS transistor 105 and the NMOS transistor 110 are both preferably ultra low power (ULP) transistors and each have a source terminal, a drain terminal, a gate terminal, and a body portion. Transistors 105 and 110 are preferably configured as low voltage devices. The voltage sources 120, 130, 140, and 150 each have a negative terminal and a positive terminal.

The negative terminal of the voltage source 130 is coupled to the ground. The positive terminal of the voltage source 130 is coupled to the negative terminal of the voltage source 140 and a source terminal of the PMOS transistor 105. A body portion of the PMOS transistor 105 is biased to a positive voltage level of the voltage source 140. A drain terminal of the PMOS transistor 105 is coupled to a drain terminal of the NMOS transistor 110. A body portion of the NMOS transistor 110 is biased to a negative voltage level of the voltage source 120. A source terminal of the NMOS transistor 110 is coupled to the ground. A gate terminal of the PMOS transistor 105 is coupled to a gate terminal of the NMOS transistor 110. The negative terminal of the voltage source 120 is coupled to the ground. The negative terminal of the voltage source 130 is also coupled to the ground. The positive terminal of the voltage source 150 is preferably coupled to the gate terminals of the PMOS transistor 105 and the NMOS transistor 110.

The voltage source 130 is preferably biased to 0.5 volts. The voltage sources 140 and 120 are preferably biased to 1.4 volts. These voltage levels are only for exemplary purposes. It is apparent to those skilled in the art that the voltage sources 120, 130, and 140 can be biased to any appropriate voltage level.

The ULP inverter 100 in FIG. 1 is shown to demonstrate a specific example of an ULP circuit. ULP circuits may also include other ULP elements such as logic gates, buffers, and the like.

Figure 2:
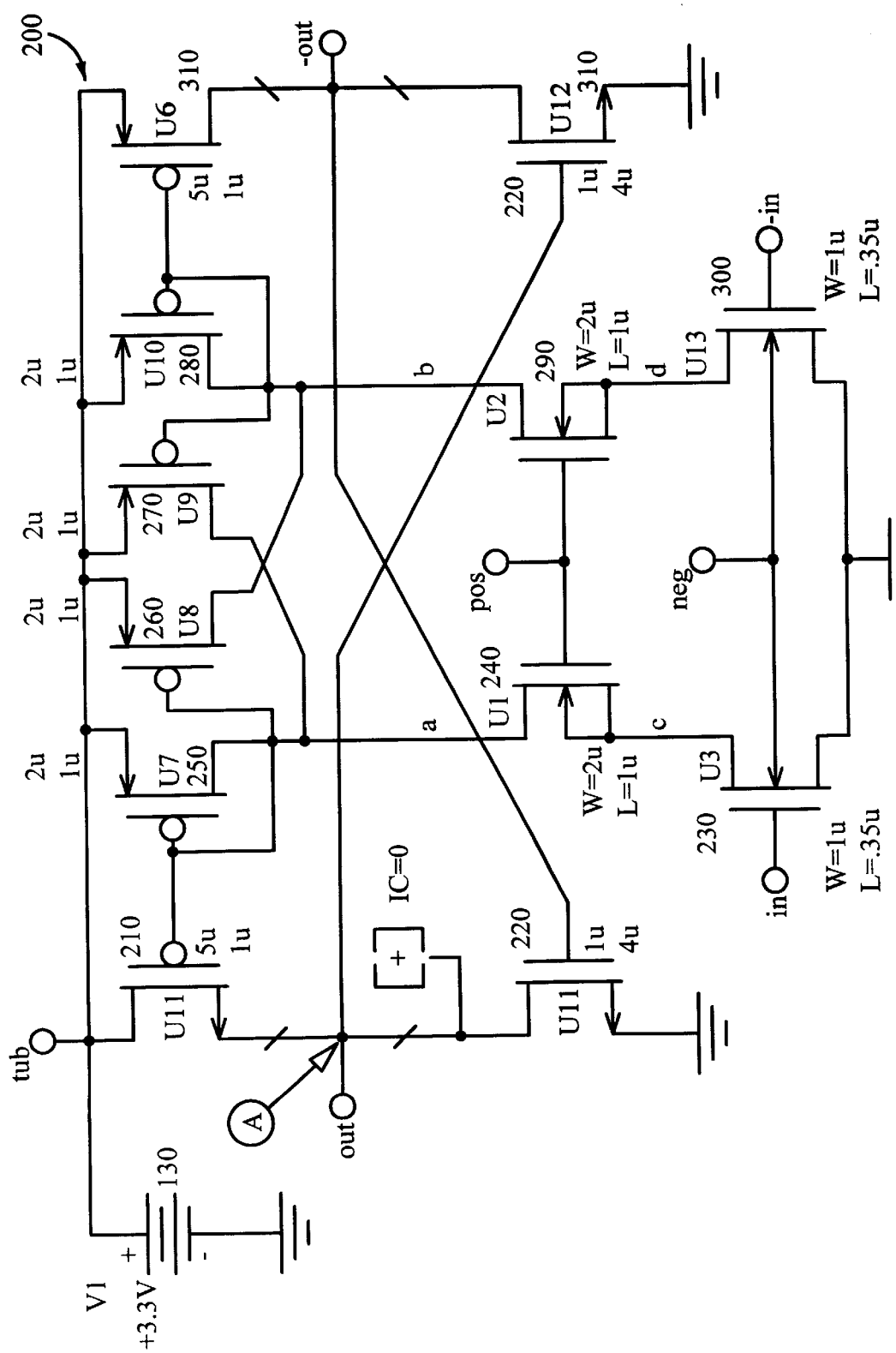
FIG. 2 illustrates a schematic diagram of an ultra low power to CMOS output converter of the present invention.

FIG. 2 illustrates a conversion circuit 200 for converting an ULP output voltage signal to an input voltage signal that is compatible with a conventional circuit having 3.3 volt CMOS devices. This circuit 200 preferably includes NMOS transistors 220, 240, 290, 320, 230, and 300; PMOS transistors 210, 250, 260, 270, 280, and 310; and a voltage source 205. Each of the NMOS and PMOS transistors have a source, drain, and gate terminals. The conversion circuit 200 is preferably configured to transform the output voltage signal from the ULP circuit which has a lower overall voltage and a smaller voltage swing compared to the conventional circuit into the input voltage signal suitable for the conventional circuit. The input voltage signal for the conventional circuit preferably satisfies a predetermined voltage swing and a predetermined voltage level required by the conventional circuit.

It is important to note that the PMOS transistors 210, 250, 260, 270, 280, and 310 and the NMOS transistors 220, 240, 290, and 320 are all 3.3 volt devices. In contrast, the NMOS transistors 230 and 300 are ULP devices. The PMOS transistors 210, 250, 260, 280, and 310, have bodies that are tied to 3.3 volts. The NMOS transistors 220 and 320 have bodies that are tied to the ground. The NMOS transistors 240 and 290 have bodies that are tied to their respective source terminals. By tying their bodies to their source terminals, the NMOS transistors 240 and 290 are able to pass more current when acting as source followers. If the bodies of the NMOS transistors 240 and 290 were tied to either the ground, their threshold voltages would increase, thus decreasing their drive currents towards the drain terminal of the PMOS transistors 210 and 310.

A negative terminal of the voltage source 205 is coupled to the ground. A positive terminal of the voltage source 205 is coupled to the source terminal of the PMOS transistors 210, 250, 260, 270, 280, and 310. The drain terminal of the PMOS transistor 250 is coupled to the gate terminal of the PMOS transistors 210, 250, and 260. The drain terminal of the PMOS transistor 280 is coupled to the gate terminal of PMOS transistors 270, 280, and 310. The drain terminal of the PMOS transistor 310 is coupled to the drain terminal of the NMOS transistor 320 and the gate terminal of the NMOS transistor 220. The drain terminal of the PMOS transistor 210 is coupled to the drain terminal of the NMOS transistor 220 and the gate terminal of the NMOS transistor 320. The drain terminal of the PMOS transistor 270 is coupled to the gate of the PMOS transistor 250 and the drain terminal of the NMOS transistor 240. The drain terminal of the PMOS transistor 260 is coupled to the gate of the PMOS transistor 280 and the drain terminal of the NMOS transistor 290. The source terminal of the NMOS transistor 240 is coupled to the body of the NMOS transistor 240 and the drain terminal of the NMOS transistor 230. The source terminal of the NMOS transistor 290 is coupled to the body of the NMOS transistor 290 and the drain terminal of the NMOS transistor 300. The source terminal of the NMOS transistors 220, 230, 300, and 320 are coupled to the ground. The gate terminal of the NMOS transistors 240 and 290 are coupled to the positive terminal of the voltage source 140 (FIG. 1). The gate terminal of the NMOS transistors 230 and 300 are coupled to the positive terminal of the voltage source 120 (FIG. 1).

The drain terminal of the PMOS transistors 210 and 310 provide a differential CMOS output voltage of 3.3 volts and ground that is configured to drive other conventional circuits such as 3.3 volt CMOS circuits. The gate terminal of the NMOS transistors 230 and 300 are configured to receive a differential input voltage from the ULP circuit. The polarity of the output voltage at the drain terminal of the PMOS transistor 210 corresponds to the polarity of the input voltage at the gate terminal of the NMOS transistor 230. Similarly, the polarity of the output voltage at the drain terminal of the PMOS transistor 310 corresponds to the polarity of the input voltage at the gate terminal of the NMOS transistor 300.

The cross coupled connections between the PMOS transistors 210 and 310, and the NMOS transistors 220 and 320, provide positive feedback to assist the circuit 200 with faster switching operations.

In use, the ULP inverter 100 (FIG. 1) drives the gate terminal of the NMOS transistors 230 and 300 differentially. Specifically, the gate terminal of the PMOS transistor 105

(FIG. 1) is coupled to the gate terminal of the NMOS transistor 230, and the drain terminal of the NMOS transistor 105 (FIG. 1) is coupled to the gate terminal of the NMOS transistor 300. The gate oxide is typically much thinner in ULP devices such as the PMOS transistor 105 (FIG. 1) and the NMOS transistors 110 (FIG. 1), 230, and 300, to compensate for any transconductance loss due to lower gate voltages compared with conventional CMOS devices. The thinner oxide gates of the PMOS transistor 105 (FIG. 1) and the NMOS transistors 110 (FIG. 1), 230, and 300, cause a lower gate-oxide breakdown voltage compared with conventional CMOS devices. The NMOS transistors 240 and 290, and the PMOS transistors 250 and 280 are arranged with the NMOS transistors 230 and 300 in a cascade configuration. This cascade configuration prevents the ULP devices (NMOS transistors 230 and 300) from exceeding their gate-oxide breakdown voltage.

The use of the ULP inverter 100 (FIG. 1) to drive the conversion circuit 200 is only for exemplary purposes. It is apparent to those skilled in the art that a number of ULP devices can be substituted for the ULP inverter 100.

For example, assume that the gate terminal of the NMOS transistor 230 is high at 0.5 volts. Then, the NMOS transistor 230 is turned on, and the NMOS transistor 300 is off. The drain terminal of the NMOS transistor 230 will attempt to go low, thus pulling the source terminal of the NMOS transistor 240 low and turning the NMOS transistor 240 on. The gate terminal of the NMOS transistors 240 and 290 are preferably tied to 1.9 volts. The current passing through the NMOS transistor 230 is channeled through the NMOS transistor 240 to the diode connected PMOS transistor 250. The current passing through the PMOS transistor 250 is mirrored to the PMOS transistors 210 and 260. The PMOS transistor 260 is utilized to ensure the drain terminal of the PMOS transistor 280 pulled up to the "tub" voltage which in this case is preferably 3.3 volts. Naturally, the drain terminal of the PMOS transistor 280 will only be pulled up within the threshold voltage of 3.3 volts since the PMOS transistor 280 is the diode-connected transistor that receives the current generated by the NMOS transistor 290. Incidentally, the NMOS transistor 290 is off. As a result, the PMOS transistor 210 is turned on and the drain gate of the PMOS transistor 210 is also pulled high. The PMOS transistor 310 is off due to the PMOS transistor 260 pulling the gate terminal to 3.3 volts. The high signal on the drain terminal of the PMOS transistor 210 pulls the gate terminal of the NMOS transistor 320 high and turns the NMOS transistor 320 on. As a result, the drain terminal of the NMOS transistor 320 is then pulled low.

It is important to note that the PMOS transistors 260 and 270 are needed to provide a positive pull-up when the currents to the PMOS transistors 250 or 280 turn off. The drain terminal of the PMOS transistors 250 or 280 that are turned off sees a high impedance as soon as it exceeds a threshold voltage below its respective source terminal.

Figure 3:
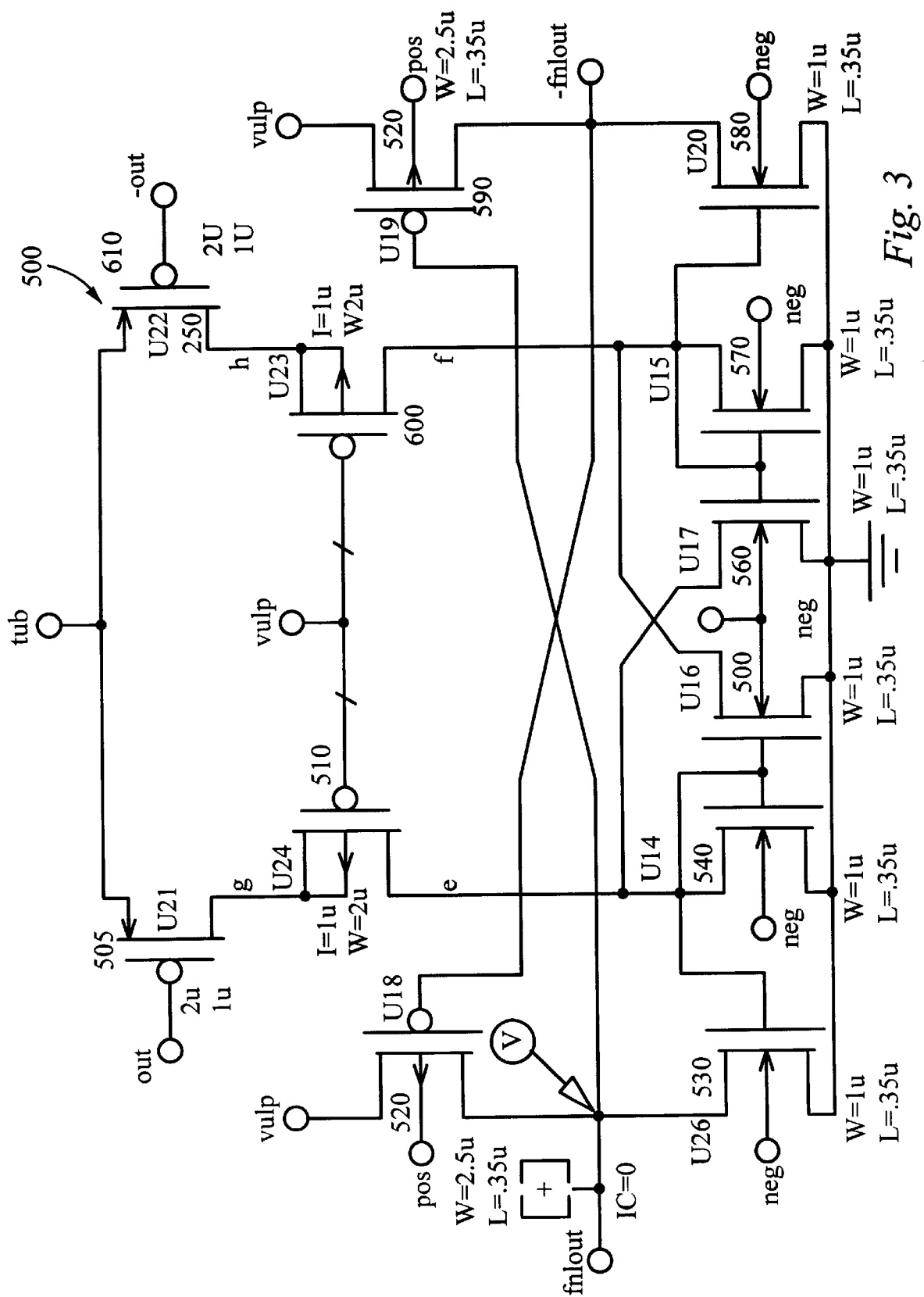
FIG. 3 illustrates a schematic diagram of a CMOS to ultra low power output converter of the present invention.

FIG. 3 illustrates a circuit 500 for converting an output voltage signal from a conventional circuit utilizing 3.3 volt devices into an input voltage signal compatible with an ULP circuit. The circuit 500 preferably includes NMOS transistors 530, 540, 550, 560, 570, and 580; and PMOS transistors 505, 510, 520, 590, 600, and 610. The NMOS and PMOS transistors each have a source terminal, a drain terminal, and a gate terminal. The circuit 500 is preferably configured to transform the output voltage signal from the conventional circuit which has a higher overall voltage and a larger voltage swing compared to the ULP circuit into the input voltage signal suitable for the ULP circuit. The input voltage signal for the ULP circuit preferably satisfies a predetermined voltage swing range and a predetermined voltage level required to properly operate the ULP circuit. Further, the ULP circuit contains elements which are damaged when the input voltage signal exceeds a predetermined upper limit. The circuit 500 ensures that the input voltage for the ULP circuit remains below the predetermined upper limit.

The PMOS transistors 505, 510, 600, and 610 are preferably 3.3 volt CMOS devices. The PMOS transistors 520 and 590, and the NMOS transistors 530, 540, 550, 560, 570, and 580, are ULP devices. Preferably, the differential output signal voltages from the circuit 200 (FIG. 2) provide the differential input signal voltages to the circuit 500. Specifically, the drain terminal of the PMOS transistors 210 and 310 (FIG. 2) are preferably coupled to the gate terminal of the PMOS transistors 505 and 610, respectively. However, it would be apparent to those skilled in the art to provide the circuit 500 with 3.3 volt differential input signals through the gate terminals of the PMOS transistors 505 and 610 from any appropriate 3.3 volt source.

The source terminal of the PMOS transistor 505 is coupled to the source terminal of the PMOS transistor 610. The drain terminal of the PMOS transistor 505 is coupled to the source terminal and a body portion of the PMOS transistor 510. The drain terminal of the PMOS transistor 610 is coupled to the source terminal and a body of the PMOS transistor 600. The gate terminal of the PMOS transistor 510 is coupled to the gate terminal of the PMOS transistor 600. The drain terminal of the PMOS transistor 510 is coupled to the drain terminal of the NMOS transistors 540 and 560 and to the gate terminal of the NMOS transistors 530, 540, and 550. The drain terminal of the PMOS transistor 600 is coupled to the drain terminal of the NMOS transistors 550 and 570 and to the gate terminal of the NMOS transistors 560, 570, and 580. The source terminal of the PMOS transistors 520 and 590 are coupled to the positive terminal of voltage supply 130 (FIG. 1). The gate terminal of the PMOS transistor 520 is coupled to the drain terminal of the PMOS transistor 590 and the drain terminal of the NMOS transistor 580. The gate terminal of the PMOS transistor 590 is coupled to the drain terminal of the PMOS transistor 520 and the drain terminal of the NMOS transistor 530. The source terminal of the NMOS transistors 530, 540, 550, 560, 570, and 580 are coupled to the ground. A body portion of the NMOS transistors 530, 540, 550, 560, 570, and 580 are biased to the positive terminal of the voltage source 120 (FIG. 1). A body portion of the PMOS transistors 520 and 590 are biased to the positive terminal of the voltage supply 140 (FIG. 1). The gate terminal of the PMOS transistors 510 and 600 are biased to the positive terminal of the voltage source 130 (FIG. 1).

The PMOS transistors 505 and 610 provide the PMOS transistors 510 and 600 with a differential current, respectively. The PMOS transistors 510 and 600 are configured in a cascade arrangement to provide excessive voltage protection to the NMOS transistors 540, 550, 560, and 570 which are ULP devices. The NMOS transistors 540 and 570 receive current from the PMOS transistors 510 and 600, respectively. In turn, the NMOS transistors 540 and 570 drives the NMOS transistors 560 and 550, respectively. The NMOS transistors 540 and 570 are mirrored to the NMOS transistors 530 and 580, respectively, which then drive the PMOS transistors 520 and 590, respectively. The gate terminals of the PMOS transistors 520 and 590, are cross-coupled to the drain terminals of the NMOS transistors 530 and 580 to provide a positive-feedback configuration. This positive-feedback configuration enhances the switching speed of the overall circuit 500. Further, the NMOS transistors 550 and 560 are utilized to ensure that the drain terminal of the NMOS transistors 540 and 570 are pulled to ground when there is no current passing through the NMOS transistors 540 and 570.

As an example of the circuit 500 in use, when the PMOS transistor 505 turns off by having the gate terminal driven to 3.3 volts, the current passing through the PMOS transistor 510 drops to zero. The NMOS transistor 540 is then left to discharge. The drain current of the NMOS transistor 540 decreases to a small value as soon as the drain and gate terminals drop to a predetermined threshold voltage above the ground. When the NMOS transistor 540 enters the subthreshold conduction region of operation, the parasitic capacitance found on the drain terminal of the NMOS transistor 540 is discharged. Since the NMOS transistor 570 is now turning on, the current passing through the NMOS transistor 570 is mirrored to the NMOS transistor 560 whose drain current then completes the discharge of the drain terminal of the NMOS transistor 540. This ensures that the NMOS transistor 540 has a clean turn off, which allows the PMOS transistor 520 to pull the drain terminal of the NMOS transistor 530 high.

Figure 4:
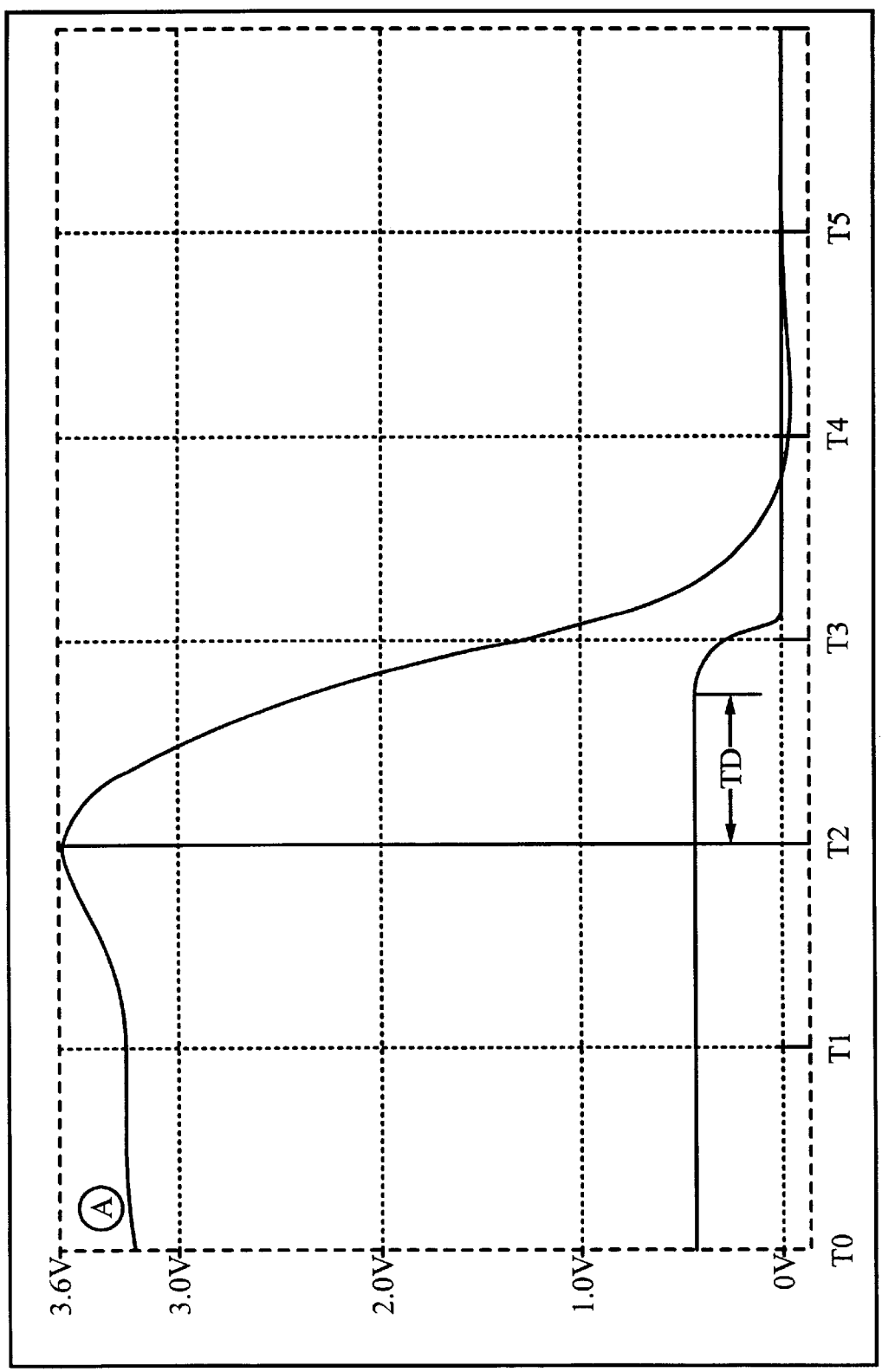
FIG. 4 illustrates a diagram showing an output signal from a conventional circuit and a converted input signal compatible with an ultra low power circuit.

FIG. 4 illustrates an output signal from a conventional circuit that is fed into the circuit 500 (FIG. 3) and a corresponding converted input signal compatible with an ULP circuit generated by the circuit 500 (FIG. 3). An output voltage signal A preferably corresponds to the output signal from the conventional circuit that is fed into the circuit 500 (FIG. 3). A converted input signal B corresponds to the output signal generated by the circuit 500 (FIG. 3) which is compatible with the ULP circuit.

The output voltage signal A initially begins at approximately 3.3 volts at time T0. At time T0, the output signal A corresponds to a high state for the conventional circuit. The converted input signal B is initially at approximately 0.5 volts at time T0. Similar to the output signal A, the converted input signal B is corresponds to a high state at time T0 for the ULP circuit. At time T0, the output signal A and the converted input signal B correspond to the high state for the conventional circuit and the ULP circuit, respectively.

At time T2, the output signal A initiates a transition to a low state for the conventional circuit. At time T2, the converted input signal B is still in the low state for the ULP circuit. There is a time delay between the output signal A and the converted input signal B. The time delay is the time between the initiation of the output signal A and the converted input signal B from their respective high states to their respective low states. In this example, the time delay is shown as TD in FIG. 4.

Between times T2 and T4, the output signal A is in the transition to the low state for the conventional circuit. At time T4, the output signal A is at approximately 0 volts which corresponds to the low state for the conventional circuit. Just before time T3, the converted input signal B initiates a transition to a low state for the ULP circuit. After the output signal A initiates the transition to the low state for the conventional circuit, the voltage level of the input signal B decreases towards 0 volts which is the low state for the ULP circuit. The input signal B finishes the transition to the low state for the ULP circuit shortly after time T3. Similar to the output signal A, the input signal B is at approximately 0 volts at time T4 which corresponds to the low state for the ULP circuit.

At time T4, both the output signal A and the input signal B are at approximately 0 volts which corresponds to the low state for both the convention circuit and the ULP circuit.

Figure 5:
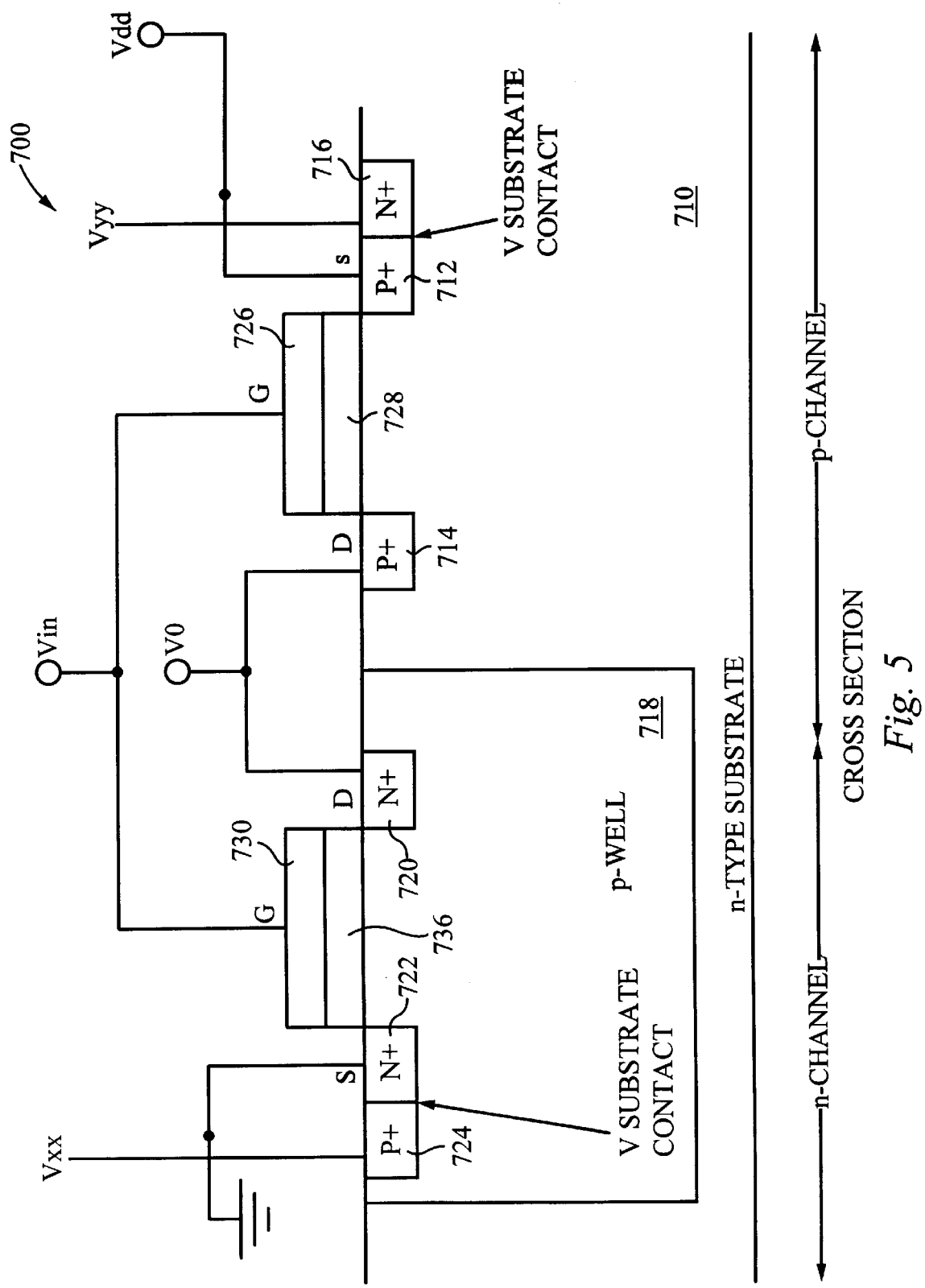
FIG. 5 illustrates a cross sectional view of means for back-biasing of the present invention.

FIG. 5 shows a cross sectional view of a CMOS integrated circuit 700 according to the present invention. The CMOS integrated circuit 700 is shown to illustrate the preferred embodiment to back-bias individual transistors. The circuit 700 shows an exemplary PMOS device and NMOS device. For the sake of simplicity and clarity, details showing interconnections between the multiple transistors according to the circuit 200 (FIG. 2) and circuit 500 (FIG. 3) are not shown. Although the circuit 700 specifically teaches back-biasing CMOS device, it would be apparent to those skilled in the art to apply back-biasing to ULP devices by merely utilizing appropriate voltage levels for ULP devices.

Figure 6:
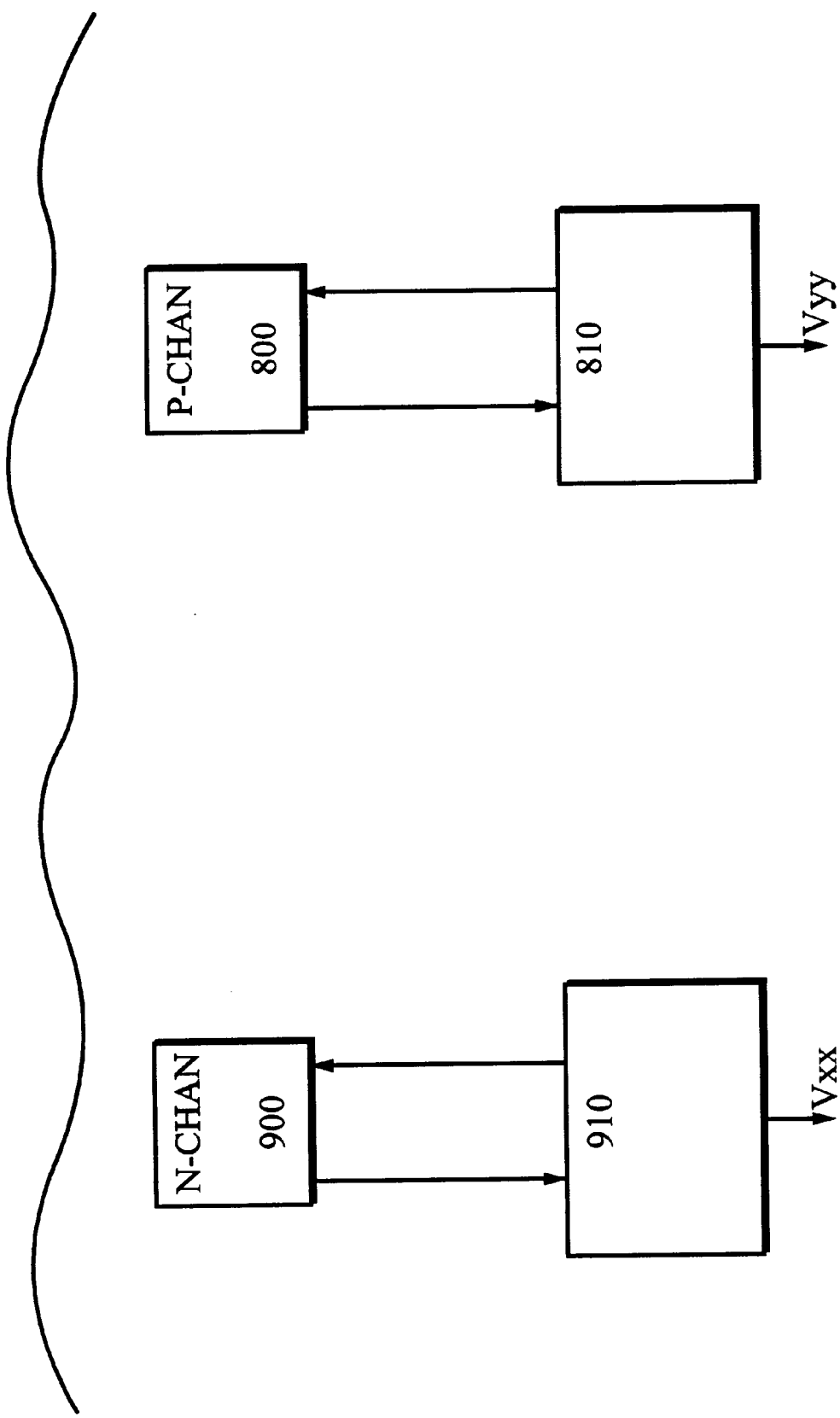
FIG. 6 illustrates a block diagram of voltage sources within the means for back-biasing.

The circuit 700 is configured with a p+ diffusion 724 which provides a contact to a p-well 718. The circuit 700 is also configured with an n+ diffusion 716 which provides a contact to an n-type substrate 710. Preferably, the p+ diffusion 724 is electrically coupled to an independent voltage source Vxx 910 (FIG. 6). Further, the n+ diffusion 716 is preferably electrically coupled to an independent voltage source Vyy 810 (FIG. 6). As a result, the p-well 718 is no longer biased to ground, and the n-type substrate 710 is no longer biased to the fixed voltage Vdd.

It is important to note that the voltage sources Vxx 910 (FIG. 6) and Vyy 810 (FIG. 6) are independent of each other and can preferably be dynamically adjusted within a range of voltage values. Accordingly, through the p+ diffusion 724 and the n+ diffusion 716, the voltages of the p-well 718 and the n-type substrate 710 are adjusted according to the voltage sources Vxx 910 and Vyy 810, respectively.

By individually adjusting the voltage level in the p-well 718 and the n-type substrate 710, the effective voltage thresholds of the NMOS and PMOS transistors, both drawn and parasitic are adjusted by changing the corresponding voltage level in their respective well or substrate (also referred to as the body.) The following equation (1) shows the relationship between any incremental change in the voltage level of the body (substrate or well) and the change in effective threshold voltage of the corresponding transistor.

$$V_t = V_{t0} + \gamma[\sqrt{2\phi + V_{SB}} - \sqrt{2\phi}] \tag{1}$$

According to the above equation (1), $V_{t0}$ is the effective threshold voltage when the voltage of the body and source of the transistor is the same. Conversely, $V_t$ represents the effective threshold voltage when the voltage of the body and source differ. The symbol, gamma, represents a physical parameter of a transistor and typically has a value of approximately 0.5 volts$^{1/2}$. The symbol, $\phi$, represents a process parameter of a transistor and typically has a value of 0.3 volts.

The circuit 700 dynamically adjusts the effective threshold voltages of the NMOS transistor and the PMOS transistor by biasing the voltages of the p-well 718 and the n-type substrate 710, respectively. Generally, this ability to adjust the voltage of the body to compensate for a radiation induced threshold voltage shift is referred to as a means for back-biasing. In particular, according to the preferred embodiment, the means for back-biasing preferably controls the voltage of the p-well 718 and the n-type substrate 710 by controlling the bias voltages Vxx and Vyy, respectively.

The bias voltages Vxx and Vyy are preferably generated by a dynamic feedback circuit 820 as shown in FIG. 6. The dynamic feedback circuit 820 is designed to independently optimize each of the resulting bias voltages Vxx and Vyy based upon a sampled performance parameter. For example, a sampling n-channel transistor 900 is utilized to sample the shift in threshold voltage for all the n-channel transistors in the p-well 718 (FIG. 5). The sampling n-channel transistor 900 is cycled through an ON and OFF state to sample and determine the present threshold voltage. The sampling n-channel transistor 900 is preferably coupled to a p-well variable voltage generator 910 which will produce the voltage Vxx and bias the p-well 718 (FIG. 5) based upon the sampled threshold voltage from the sampling n-channel transistor 900. The connection between the p-well voltage generator 910 and the p-well 718 is shown in FIG. 5 as the p+ diffusion 724.

Similarly, a sampling p-channel transistor 800 can be utilized in the n-type substrate 710 (FIG. 5) to sample the shift in threshold voltage for all the p-channel transistors in the n-type substrate 710. As in the n-channel sampling transistor 900, the p-channel sampling transistor 800 is also preferably cycled through an ON and OFF state to sample the present threshold voltage. The sampling p-channel transistor 800 is preferably coupled to an n-type substrate variable voltage generator 810. The n-type substrate variable generator 810 produces the voltage Vyy and, as a result also biases the n-type substrate 710 based upon the sampled threshold voltage from the sampling p-channel transistor 800. The connection between the n-type substrate 710 and the n-type variable voltage generator 810 is shown in FIG. 5 as the n+ diffusion 716.

Although the specific circuitry for the p-well variable voltage generator 910 and the n-type substrate variable voltage generator 810 is not shown, it is apparent to a person with ordinary skill in the art that constructing the voltage generators 910 and 810 to create the bias voltages to provide the means for back-biasing can be accomplished without undue experimentation.

Accordingly, the inclusion of this means for back-biasing will allow a variety of combinational logic memory circuits to maintain operational performance over a given range of radiation induced threshold voltage shift. In particular, such combinational logic can include but are not limited to pass transistor circuits, and such memory circuits can include but are not limited to latches and RAM cells.

The radiation induced threshold voltage shift is a cumulative process which is dependent on the total ionizing radiation dose effect. Although back-biasing the body is effective in neutralizing the total ionization radiation dose effect, there is a maximum limit to the amount of total ionizing dose radiation that can be tolerated. This maximum limit is related to the maximum radiation induced threshold voltage shift that can be compensated by the means for back-biasing and the inherent trapped oxide charge collection capabilities of the CMOS fabrication process.

Further, as another important advantage, the back-biasing means limits the parasitic channel leakage currents and also minimizes resulting power consumption of the CMOS circuit. In addition to compensating for the radiation induced threshold voltage shift in the drawn transistors, the means for back-biasing can also compensate for the radiation induced threshold voltage shift in the inherent parasitic transistors found in the CMOS circuit.

It would be apparent to those ordinarily skilled in the art that the complementary CMOS processes to the one disclosed here will be similarly handled. In particular, an n-well can be substituted for the n-type substrate 710 (FIG. 5) and a p-type substrate can be substituted for the p-well 718 (FIG. 5). Similarly, in a double well CMOS process, a voltage for the p-well will preferably be controlled by the voltage source Vxx, and a voltage for the n-well will preferably be controlled by the voltage source Vyy.

In addition to CMOS processes, it would also be apparent to those with ordinary skill in the art to apply the means for back-biasing to any combination of n-channel and p-channel devices. For example, the means for back-biasing can be utilized on a circuit only having n-channel devices to counteract the effects of total ionization dose effects. Likewise, the means for back-biasing can also be utilized on a circuit only having p-channel devices to counteract the effects of total ionization dose effects.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

Specifically, it will be apparent to one of ordinary skill in the art that the device of the present invention could be implemented in several different ways and the apparatus disclosed above is only illustrative of the preferred embodiment of the invention and is in no way a limitation. The present invention is shown for exemplary purposes.

What is claimed is:

1. A converter for reducing an output voltage from a conventional circuit comprising means for lowering the output voltage, wherein the means for lowering comprises a plurality of transistors including a conventional transistor and an ultra low power transistor wherein the plurality of transistors are arranged in a cascade configuration to prevent damage to the ultra low power transistor, thereby forming an input voltage that corresponds to an ultra low power circuit, wherein the converter is configured to couple between the conventional circuit and the ultra low power circuit, the converter further comprising means for back-biasing coupled to the means for lowering for biasing a substrate of the ultra low power transistor such that an effective threshold voltage of the ultra low power transistor is dynamically maintained at a predetermined level.

2. The converter as claimed in claim 1 wherein the means for back-biasing further comprises a voltage source coupled to the substrate.

3. A converter for reducing an output voltage from a conventional circuit comprising means for lowering the output voltage, wherein the means for lowering comprises a plurality of transistors including a conventional transistor and an ultra low power transistor wherein the plurality of transistors are arranged in a cascade configuration to prevent damage to the ultra low power transistor, thereby forming an input voltage that corresponds to an ultra low power circuit, wherein the converter is configured to couple between the conventional circuit and the ultra low power circuit, the converter further comprising means for back-biasing coupled to the means for lowering for biasing a substrate of the conventional transistor such that an effective threshold voltage of the conventional transistor is dynamically maintained at a predetermined level.

4. The converter as claimed in claim 3 wherein the means for back-biasing further comprises a voltage source coupled to the substrate.

5. A converter for lowering an output voltage from a conventional circuit, the converter comprising:
   a. an input terminal configured for receiving the output voltage from the conventional circuit;
   b. a plurality of transistors coupled to the input terminal for reducing the output voltage thereby forming an input voltage, wherein at least two of the plurality of transistors are cross coupled such that switching speed of the converter is enhanced, wherein the plurality of transistors comprise a conventional CMOS device and an ultra low power CMOS device, and wherein the plurality of transistors are arranged in a cascade configuration to prevent damage to the ultra low power CMOS device;

c. an output terminal coupled to the plurality of transistors configured for delivering the input voltage to an ultra low power circuit; and d. a back-biasing system coupled to the ultra low power CMOS device for biasing a substrate of the ultra low power CMOS device such that an effective threshold voltage of the ultra low power CMOS device is dynamically maintained at a predetermined level.

6. The converter according to claim 5 wherein the back-biasing system further comprises a voltage source coupled to the substrate.

7. A converter for lowering an output voltage from a conventional circuit, the converter comprising:

a. an input terminal configured for receiving the output voltage from the conventional circuit;

b. a plurality of transistors coupled to the input terminal for reducing the output voltage thereby forming an input voltage, wherein at least two of the plurality of transistors are cross coupled such that switching speed of the converter is enhanced, wherein the plurality of transistors comprise a conventional CMOS device and an ultra low power CMOS device, and wherein the plurality of transistors are arranged in a cascade configuration to prevent damage to the ultra low power CMOS device;

c. an output terminal coupled to the plurality of transistors configured for delivering the input voltage to an ultra low power circuit; and d. a back-biasing system coupled to the conventional CMOS device for biasing a substrate of the conventional CMOS device such that an effective threshold voltage of the conventional CMOS device is dynamically maintained at a predetermined level.

8. The converter according to claim 7 wherein the back-biasing system further comprises a voltage source coupled to the substrate.

9. A converter for increasing an output voltage originating from an ultra low power circuit including means for raising the output voltage, wherein the means for raising comprises a plurality of transistors including a conventional transistor and an ultra low power transistor wherein the plurality of transistors are arranged in a cascade configuration to prevent damaging the ultra low power transistor, thereby forming an input voltage that corresponds to a conventional circuit, wherein the converter is configured to couple between the conventional circuit and the ultra low power circuit, the converter further comprising a back biasing system coupled to the ultra low power transistor for biasing a substrate of the ultra low power transistor such that an effective threshold voltage of the ultra low power transistor is dynamically maintained at a predetermined level.

10. The converter according to claim 9 wherein the back-biasing system further comprises a voltage source coupled to the substrate.

11. A converter for increasing an output voltage originating from an ultra low power circuit including means for raising the output voltage, wherein the means for raising comprises a plurality of transistors including a conventional transistor and an ultra low power transistor wherein the plurality of transistors are arranged in a cascade configuration to prevent damaging the ultra low power transistor, thereby forming an input voltage that corresponds to a conventional circuit, wherein the converter is configured to couple between the conventional circuit and the ultra low power circuit, the converter further comprising a back biasing system coupled to the conventional transistor for biasing a substrate of the conventional transistor such that an effective threshold voltage of the conventional transistor is dynamically maintained at a predetermined level.

12. The converter according to claim 11 wherein the back-biasing system further comprises a voltage source coupled to the substrate.

13. A converter for increasing an output voltage from an ultra low power circuit, the converter comprising:

a. an input terminal configured for receiving the output voltage;

b. a plurality of transistors coupled to the input terminal for increasing the output voltage thereby forming an input voltage for a conventional circuit, wherein at least two of the plurality of transistors are cross coupled such that switching speed of the converter is enhanced, wherein the plurality of transistors comprise a conventional CMOS device and an ultra low power CMOS device, and wherein the plurality of transistors are arranged in a cascade configuration to prevent the ultra low power CMOS device from damage;

c. an output terminal coupled to the plurality of transistors configured for delivering the input voltage to the conventional circuit; and wherein the plurality of transistors are arranged in a cascade configuration to prevent the ultra low power CMOS device from damage; and d. a back-biasing system coupled to the ultra low power CMOS device for biasing a substrate of the ultra low power CMOS device such that an effective threshold voltage of the ultra low power CMOS device is dynamically maintained at a predetermined level.

14. The converter according to claim 13 wherein the back-biasing system further comprises a voltage source coupled to the substrate.

15. A converter for increasing an output voltage from an ultra low power circuit, the converter comprising:

a. an input terminal configured for receiving the output voltage;

b. a plurality of transistors coupled to the input terminal for increasing the output voltage thereby forming an input voltage for a conventional circuit, wherein at least two of the plurality of transistors are cross coupled such that switching speed of the converter is enhanced, wherein the plurality of transistors comprise a conventional CMOS device and an ultra low power CMOS device, and wherein the plurality of transistors are arranged in a cascade configuration to prevent the ultra low power CMOS device from damage;

c. an output terminal coupled to the plurality of transistors configured for delivering the input voltage to the conventional circuit; and wherein the plurality of transistors are arranged in a cascade configuration to prevent the ultra low power CMOS device from damage; and d. a back-biasing system coupled to the conventional CMOS device for biasing a substrate of the conventional CMOS device such that an effective threshold voltage of the conventional CMOS device is dynamically maintained at a predetermined level.

16. The converter according to claim 15 wherein the back-biasing system further comprises a voltage source coupled to the substrate.

* * * * *